(12) United States Patent
Yoneda

(10) Patent No.: US 7,649,222 B2
(45) Date of Patent: Jan. 19, 2010

(54) SEMICONDUCTOR DEVICE

(75) Inventor: Haruki Yoneda, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/963,359

(22) Filed: Dec. 21, 2007

(65) Prior Publication Data

US 2008/0150017 A1    Jun. 26, 2008

(30) Foreign Application Priority Data

Dec. 25, 2006   (JP)   ............................. 2006-348088

(51) Int. Cl.
    *H01L 29/94* (2006.01)
(52) U.S. Cl. .................. 257/330; 257/302; 257/331; 257/329; 257/E21.418; 257/E29.257; 257/E29.262; 257/E29.274
(58) Field of Classification Search .......... 257/E21.418, 257/E21.419, 328, 330, 331, 332, 302, E29.182, 257/E29.189, E29.256, E29.258, E29.262, 257/E29.274, E.257, 342, 329, 341

See application file for complete search history.

(56) References Cited

U.S. PATENT DOCUMENTS

| 6,008,520 | A |  | 12/1999 | Darwish et al. |
| 6,040,599 | A | * | 3/2000 | Takahashi ................ 257/330 |
| 6,580,123 | B2 |  | 6/2003 | Thapar |
| 2005/0029584 | A1 |  | 2/2005 | Shiraishi et al. |
| 2007/0120194 | A1 |  | 5/2007 | Shiraishi et al. |

FOREIGN PATENT DOCUMENTS

| JP | 8250732 A | 9/1996 |
| JP | 8-316479 | 11/1996 |
| JP | 2647884 | 5/1997 |
| JP | 10-507880 A | 7/1998 |
| JP | 11-501459 A | 2/1999 |
| JP | 2002-26324 A | 1/2002 |
| JP | 2005-057050 | 3/2005 |
| WO | 96/24953 | 8/1996 |
| WO | 97/07547 | 2/1997 |

OTHER PUBLICATIONS

"Power MOS FET Structure and Features," Renesas Technology Corp, Jul. 2004, pp. 1-5, RJJ27G0014-0100Z/Rev.1.00.
Japanese Office Action for corresponding Patent Application No. JP 2006-348088, dated Aug. 4, 2009, Japan.

* cited by examiner

*Primary Examiner*—N Drew Richards
*Assistant Examiner*—Yu-Hsi Sun
(74) *Attorney, Agent, or Firm*—Ditthavong, Mori & Steiner, P.C.

(57) ABSTRACT

This semiconductor device includes a first conductivity type first semiconductor layer formed on the upper surface of a substrate, a first conductivity type second semiconductor layer formed on the first semiconductor layer, a first conductivity type third semiconductor layer formed on the second semiconductor layer, a second conductivity type fourth semiconductor layer formed on the third semiconductor layer, a first conductivity type fifth semiconductor layer formed on the fourth semiconductor layer and an electrode formed in a trench, so provided as to reach the second semiconductor layer through at least the fifth semiconductor layer, the fourth semiconductor layer and the third semiconductor layer, in contact with an insulating film, while the upper surface of the second semiconductor layer is arranged upward beyond the lower end of the electrode.

15 Claims, 4 Drawing Sheets

SEMICONDUCTOR DEVICE

BACKGROUND OF THE INVENTION

1. Field of the Invention

The present invention relates to a semiconductor device, and more particularly, it relates to a semiconductor device having an electrode embedded in a trench in contact with an insulating film.

2. Description of the Background Art

A trench gate type power MISFET (metal insulator semiconductor field-effect transistor) (semiconductor device) having an electrode embedded in a trench through an insulating film is known in general, as disclosed in Japanese Patent Laying-Open No. 2005-57050, for example.

In the conventional power MISFET disclosed in the aforementioned Japanese Patent Laying-Open No. 2005-57050, a channel layer (base layer) is formed on a drain layer, while a source layer is formed on the channel layer. In this power MISFET, a gate electrode is formed in a trench so provided as to reach the drain layer through the source layer and the channel layer through a gate insulating film. In this power MISFET, further, the trench is so shallowly formed as to arrange the lower end of the gate electrode in the vicinity of the upper surface of the drain layer. Thus, gate capacitance can be reduced.

In the power MISFET disclosed in the aforementioned Japanese Patent Laying-Open No. 2005-57050, however, a depletion layer formed on a p-n junction between the drain layer and the channel layer extends downward beyond the lower end of the gate electrode arranged in the vicinity of the upper surface of the drain layer, to disadvantageously increase ON-state resistance.

SUMMARY OF THE INVENTION

The present invention has been proposed in order to solve the aforementioned problem, and an object of the present invention is to provide a semiconductor device capable of reducing the capacitance of an electrode and preventing formation of a depletion layer downward beyond the lower end of the electrode.

In order to attain the aforementioned object, a semiconductor device according to an aspect of the present invention comprises a first conductivity type first semiconductor layer, formed on the upper surface of a substrate, having a first impurity concentration, a first conductivity type second semiconductor layer, formed on the first semiconductor layer, having a second impurity concentration higher than the first impurity concentration, a first conductivity type third semiconductor layer, formed on the second semiconductor layer, having a third impurity concentration lower than the second impurity concentration, a second conductivity type fourth semiconductor layer formed on the third semiconductor layer, a first conductivity type fifth semiconductor layer formed on the fourth semiconductor layer and an electrode formed in a trench, so provided as to reach the second semiconductor layer through at least the fifth semiconductor layer, the fourth semiconductor layer and the third semiconductor layer, in contact with an insulating film, while the upper surface of the second semiconductor layer is arranged upward beyond the lower end of the electrode.

As hereinabove described, the semiconductor device according to the aspect of the present invention is provided with the second semiconductor layer having the second impurity concentration higher than the first and third impurity concentrations while the upper surface of the second semiconductor layer is arranged upward beyond the lower end of the electrode. Also when the trench is shallowly formed in order to reduce the capacitance of the electrode (gate electrode), therefore, the second semiconductor layer can inhibit a depletion layer formed on a p-n junction between the third semiconductor layer (drain region) and the fourth semiconductor layer (base region) from extending downward beyond the lower end of the gate electrode in a state where no voltage is applied between the first semiconductor layer (drain region) and the fifth semiconductor layer (source region). Thus, the drain region located under the lower end of the gate electrode can be inhibited from formation of a depletion layer whose potential is hardly controllable with the gate electrode. Therefore, the semiconductor device can be inhibited from increase of ON-state resistance. Thus, the semiconductor device can be inhibited from reduction in responsibility in a linear region.

Further, the first conductivity type third semiconductor layer having the third impurity concentration lower than the second impurity concentration of the second semiconductor layer is provided on the interface between the first conductivity type second semiconductor layer and the second conductivity type fourth semiconductor layer. Thus, the width of a depletion layer formed on the p-n junction of the interface between the third and fourth semiconductor layers can be increased as compared with a case of directly bonding the second and fourth semiconductor layers to each other. Therefore, the p-n junction can be inhibited from reduction in avalanche resistance. In addition, the semiconductor device is provided with the first semiconductor layer having the first impurity concentration lower than the second impurity concentration. Thus, the first semiconductor layer having higher resistance than the second semiconductor layer can relax an electric field resulting from a voltage applied between the first and fifth semiconductor layers. Therefore, the semiconductor device can be inhibited from reduction in withstand voltage.

In the semiconductor device according to the aforementioned aspect, the lower surface of the second semiconductor layer is preferably arranged on a position of a depth corresponding to a portion close to the lower end of the electrode. According to this structure, the thickness of the second semiconductor layer can be reduced dissimilarly to a case of arranging the lower surface of the second semiconductor layer downward beyond the lower end of the trench. Thus, the surface area of the electrode opposed to the second semiconductor layer having the second impurity concentration higher than the first and third impurity concentrations through the insulating film can be reduced. Therefore, increase in the capacitance of the electrode can be suppressed. When a high voltage is applied to the drain, a depletion layer can so sufficiently spread that the semiconductor device can have a high withstand voltage.

In this case, the thickness of the second semiconductor layer may be substantially equal to the thickness of the third semiconductor layer.

In the semiconductor device according to the aforementioned aspect, a p-n junction is preferably formed on the interface between the third semiconductor layer and the fourth semiconductor layer. According to this structure, the lower end of the electrode arranged downward beyond the upper surface of the second semiconductor layer (lower surface of the third semiconductor layer) and the portion (interface between the third and fourth semiconductor layers) provided with the p-n junction can be separated from each other by at least the thickness of the third semiconductor layer.

Thus, a depletion layer formed on the p-n junction can be inhibited from extending downward beyond the lower end of the electrode.

In the semiconductor device according to the aforementioned aspect, the lower surface of the second semiconductor layer is preferably arranged downward beyond the lower end of the trench. According to this structure, the insulating film and the electrode are not arranged on the boundary between the first and second semiconductor layers, whereby the contact area between the first and second semiconductor layers can be increased. Thus, an area of the first semiconductor layer passing a current therethrough can be increased, thereby reducing the ON-state resistance of the semiconductor device.

In this case, the thickness of the second semiconductor layer is preferably larger than the thickness of the third semiconductor layer. According to this structure, the lower surface of the second semiconductor layer can be easily arranged downward beyond the lower end of the trench.

In the semiconductor device according to the aforementioned aspect, the thicknesses of the second semiconductor layer and the third semiconductor layer may be smaller than the thickness of the first semiconductor layer.

In the semiconductor device according to the aforementioned aspect, the fifth semiconductor layer preferably has a fourth impurity concentration, and the second impurity concentration of the second semiconductor layer is preferably lower than the fourth impurity concentration of the fifth semiconductor layer. According to this structure, the capacitance between the electrode and the second semiconductor layer can be inhibited from increase resulting from the second impurity concentration of the second semiconductor layer, whereby increase in the capacitance of the electrode can be further suppressed.

In the semiconductor device according to the aforementioned aspect, the first impurity concentration of the first semiconductor layer and the third impurity concentration of the third semiconductor layer are preferably substantially identical to each other, and the second impurity concentration of the second semiconductor layer is preferably higher than the first impurity concentration of the first semiconductor layer and the third impurity concentration of the third semiconductor layer. According to this structure, the third semiconductor layer can be formed simultaneously with the first semiconductor layer, whereby increase in the number of manufacturing steps can be suppressed.

In the semiconductor device according to the aforementioned aspect, the thickness of the first conductivity type third semiconductor layer may be smaller than the thickness of the second conductivity type fourth semiconductor layer.

In the semiconductor device according to the aforementioned aspect, the electrode is preferably a gate electrode, and a portion close to the lower end of the gate electrode is preferably rounded. According to this structure, field concentration on corner portions can be suppressed dissimilarly to a case where the portion close to the lower end of the gate electrode is angularly formed.

In the semiconductor device according to the aforementioned aspect, the first semiconductor layer, the fourth semiconductor layer and the fifth semiconductor layer are preferably a drain drift layer, a base layer and a source diffusion layer respectively, and the second semiconductor layer and the third semiconductor layer are preferably arranged between the drain drift layer and the base layer. According to this structure, the drain drift layer located under the lower end of the electrode can be inhibited from formation of a depletion layer whose potential is hardly controllable with the electrode. Therefore, the semiconductor device can be inhibited from increase of ON-state resistance resulting from a depletion layer formed on the drain drift layer.

In the semiconductor device according to the aforementioned aspect, the substrate preferably has a first conductivity type fifth impurity concentration higher than the first impurity concentration of the first semiconductor layer, the second impurity concentration of the second semiconductor layer and the third impurity concentration of the third semiconductor layer. According to this structure, resistance of the substrate can be reduced, whereby contact resistance between a drain electrode and the substrate can be reduced when the drain electrode is connected to the substrate.

In the semiconductor device according to the aforementioned aspect, a first conductivity type first impurity may be introduced into the second semiconductor layer and the third semiconductor layer, and a first conductivity type second impurity different from the first conductivity type first impurity may be introduced into the fifth semiconductor layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 2:
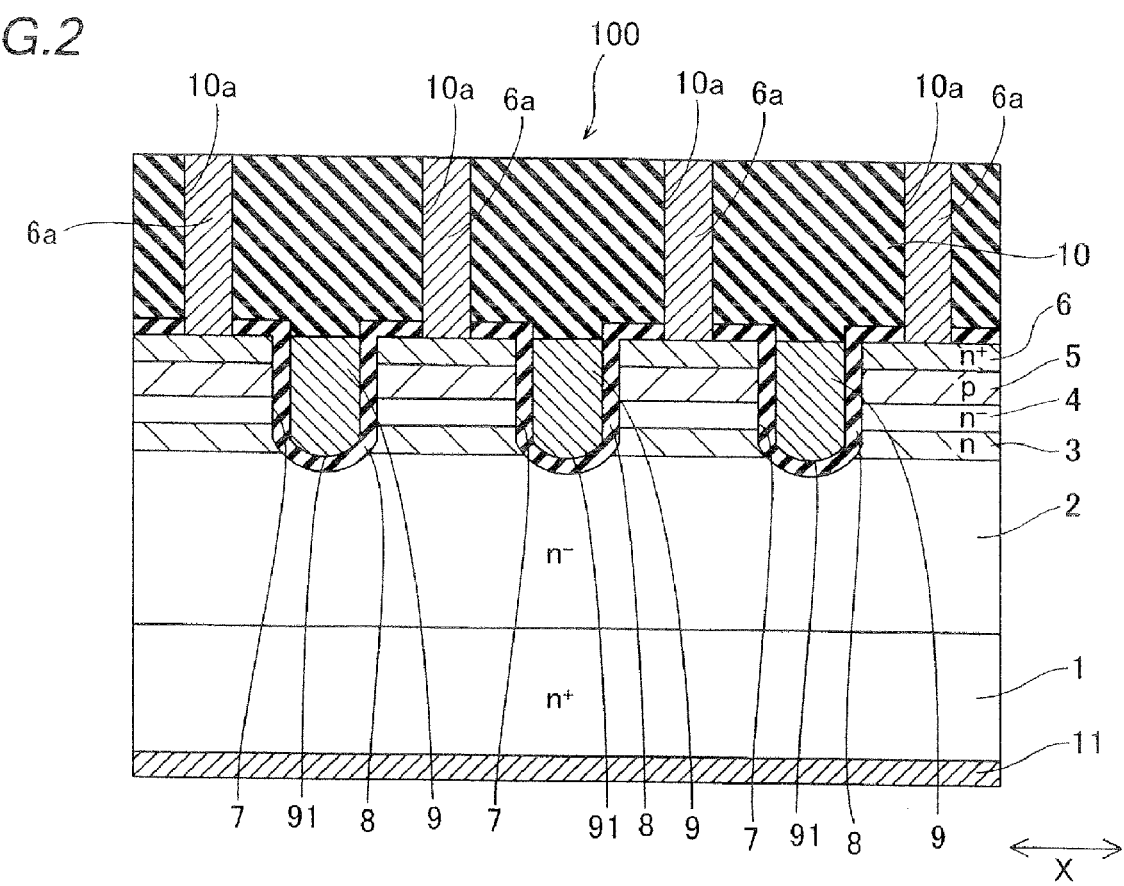
FIG. 2 is a sectional view taken along the line 500-500 in FIG. 1.

In a power MOSFET 100 according to a first embodiment of the present invention, an n$^-$-type drain drift layer 2 is formed on an n$^+$-type single-crystalline silicon substrate 1, as shown in FIG. 2. This drain drift layer 2 is formed by an epitaxial silicon layer doped with phosphorus (P). The drain drift layer 2 is an example of the "first semiconductor layer" in the present invention. The impurity concentration of the silicon substrate 1 is higher than that of the drain drift layer 2 and those of an n-type impurity layer 3 and an n$^-$-type impurity layer 4 described later.

An impurity layer 3 having a thickness of about 0.2 μm, smaller than the thickness of the drain drift layer 2, is formed on the drain drift layer 2. This impurity layer 3 is formed by doping an epitaxial silicon layer with phosphorus (P), to have an impurity concentration higher than that of the drain drift layer 2. The impurity layer 3 is an example of the "second semiconductor layer" in the present invention.

Another impurity layer 4 having a thickness substantially equal to that of the impurity layer 3 is formed on the impurity layer 3. This impurity layer 4 has an impurity concentration substantially equal to that of the drain drift layer 2. The impurity concentrations of the drain drift layer 2 and the impurity layer 4 are smaller than that of the impurity layer 3. The impurity layer 4 is an example of the "third semiconductor layer" in the present invention.

A base layer 5 having a thickness larger than those of the impurity layers 3 and 4 is formed on the impurity layer 4. A depletion layer is formed on a p-n junction between the impurity layer 4 and the base layer 5. The base layer 5 is an example of the "fourth semiconductor layer" in the present invention.

An n+-type source diffusion layer 6 having a thickness of about 0.2 μm is formed on the base layer 5. This base layer 5 has an impurity concentration higher than that of the impurity layer 3. The source diffusion layer 6 is an example of the "fifth semiconductor layer" in the present invention.

In the power MOSFET 100, a plurality of trenches 7 are so formed as to reach the drain drift layer 2 through the source diffusion layer 6, the base layer 5 and the impurity layers 4 and 3. The plurality of trenches 7 are formed at a prescribed interval in a direction X. Gate insulating films 8 are formed on the surfaces of the trenches 7, and gate electrodes 9 are formed in contact with the gate insulating films 8. Portions close to lower ends 91 of the gate electrodes 9 are rounded. The lower ends 91 of the gate electrodes 9 are arranged downward beyond the upper surface of the impurity layer 3. The lower surface of the impurity layer 3 is arranged on a position of a depth corresponding to the portions close to the lower ends 91 of the gate electrodes 9.

An Interlayer dielectric film 10 is formed on the source diffusion layer 6 and the gate electrodes 9. This interlayer dielectric film 10 is formed by a silicon oxide film, and has a plurality of contact holes 10a. A conductive material is embedded in the contact holes 10a, thereby forming plugs 6a. These plugs 6a are connected with the source diffusion layer 6. A drain electrode 11 is formed in contact with the lower surface (rear surface) of the silicon substrate 1.

Figure 1:
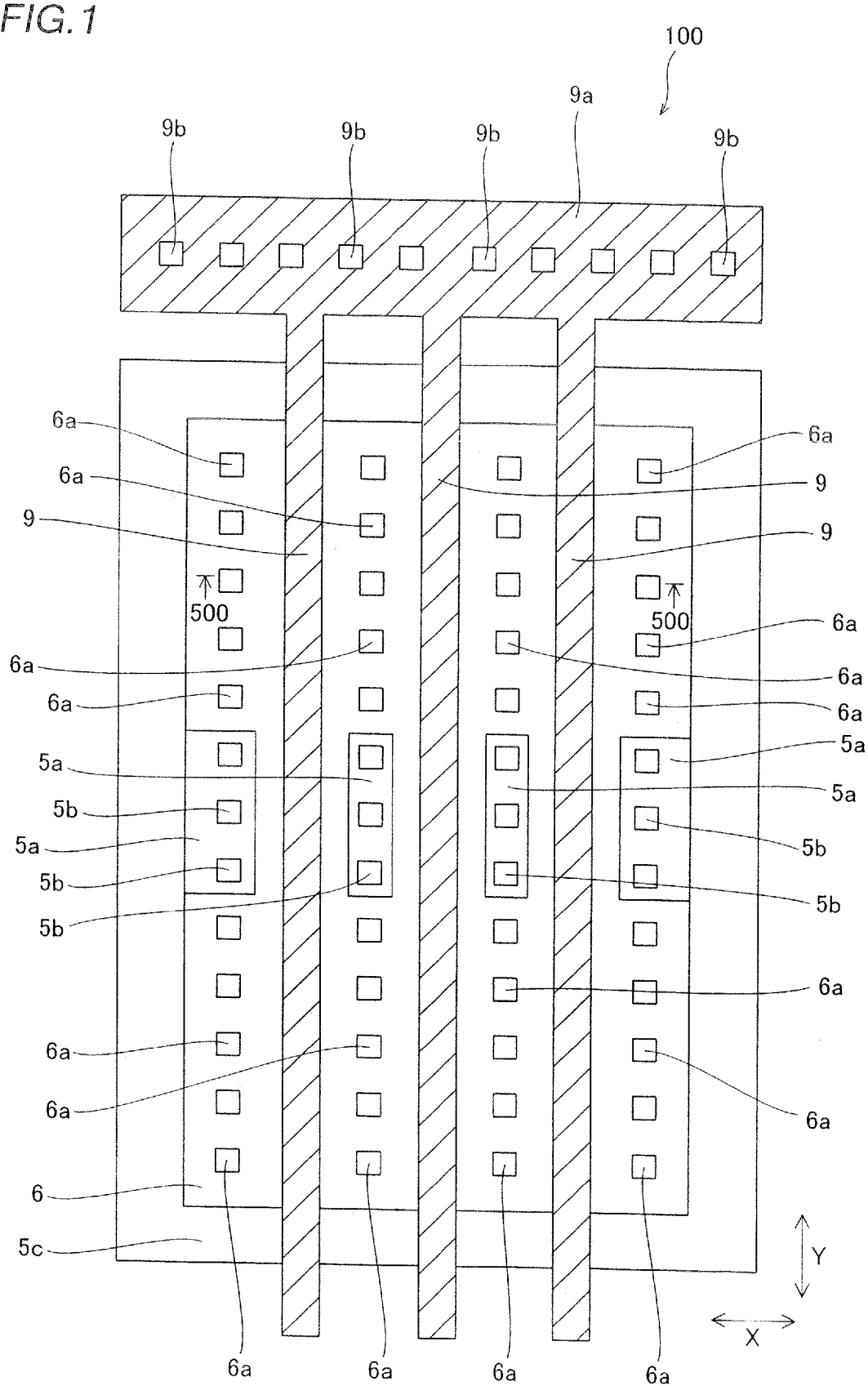
FIG. 1 is a plan view for illustrating the structure of a power MOSFET according to a first embodiment of the present invention.

As shown in FIG. 1, the plurality of gate electrodes 9 are so formed as to extend in a direction Y in plan view, and connected to a coupling portion 9a on first ends in the direction Y. A plurality of plugs 9b are formed on the coupling portion 9a. The plugs 9b are so provided as to connect wires (not shown) for supplying a voltage to the gate electrodes 9. Contact layers 5a are formed on prescribed regions of the base layer 5 (see FIG. 2). A plurality of plugs 5b are connected to the contact layers 5a. A base layer 5c is so formed as to enclose the source diffusion layer 6 in plan view.

A process for manufacturing the power MOSFET 100 according to the first embodiment of the present invention is now described with reference to FIGS. 3(a) to 3(e).

First, an epitaxial silicon layer 20 doped with phosphorus is formed on the silicon substrate 1. A silicon oxide film 21 is formed on the epitaxial silicon layer 20 by thermal oxidation. Thereafter resist films 22 are formed on prescribed regions of the silicon oxide film 21 by photolithography, as shown in FIG. 3(a).

Figure 3:
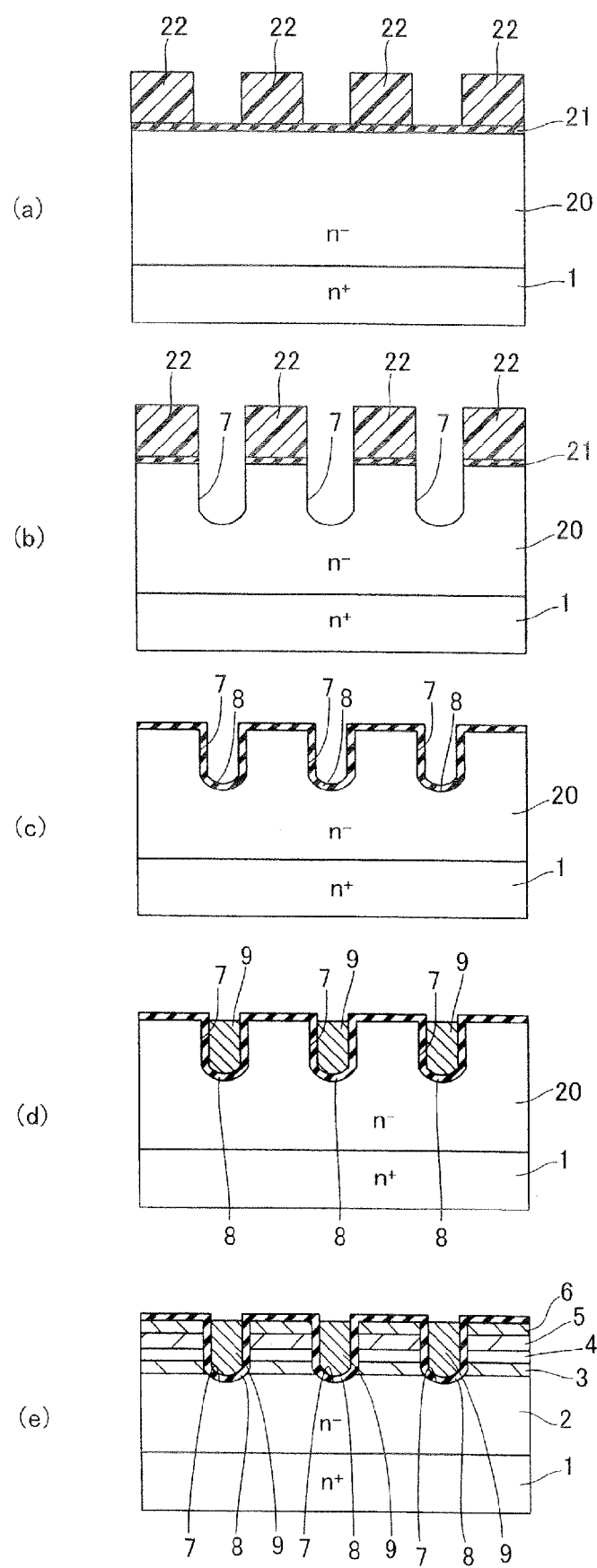
FIGS. 3(a) to 3(e) are sectional views for illustrating a process for manufacturing the power MOSFET according to the first embodiment of the present invention.

Then, the resist films 22 are employed as masks for patterning the silicon oxide film 21 and the epitaxial silicon layer 20 by anisotropic etching, thereby forming the trenches 7 having a depth of about 1 μm, as shown in FIG. 3(b). Thereafter the resist films 22 are removed.

Then, the gate insulating films 8 having a thickness of about 15 nm are formed by thermal oxidation, as shown in FIG. 3(c). Then, a polysilicon layer is so deposited as to fill up the trenches 7. POCl₃ (phosphorus oxychloride) employed as an impurity dispersing agent is applied onto the upper surface of the polysilicon layer and thereafter heat-treated, for doping the polysilicon layer with phosphorus (P). Thereafter the polysilicon layer is so etched back as to form the gate electrodes 9 as shown in FIG. 3(d).

Then, ion implantation is performed on the epitaxial silicon layer 20. More specifically, phosphorus ions (P+) are implanted into the epitaxial silicon layer 20, thereby forming the impurity layer 3 as shown in FIG. 3(e). Further, boron ions (B+) are implanted into the epitaxial silicon layer 20, thereby forming the base layer 5. In addition, arsenic ions (As+) are implanted into the epitaxial silicon layer 20, thereby forming the source diffusion layer 6. The impurity layer 4 having the same impurity concentration as the epitaxial silicon layer 20 is formed between the regions provided with the impurity region 3 and the base layer 5 respectively. The drain drift layer 2 having the same impurity concentration as the epitaxial silicon layer 20 is formed under the impurity layer 3.

Thereafter heat treatment is performed by RTA (rapid thermal annealing), thereby recovering the layers 3, 5 and 6 from crystal defects resulting from the ion implantation and activating the phosphorus ions, the boron ions and the arsenic ions implanted for forming the impurity layer 3, the base layer 5 and the source diffusion layer 6 respectively.

Then, the interlayer dielectric film 10 of silicon oxide is formed by PE-CVD (plasma enhanced chemical vapor deposition). Then, the contact holes 10a are formed in the interlayer dielectric film 10, so that the plugs 6a are thereafter formed in the contact holes 10a. Thereafter the drain electrode 11 is formed on the lower surface (rear surface) of the silicon substrate 1, thereby forming the power MOSFET 100 according to the first embodiment as shown in FIG. 1.

According to the first embodiment, as hereinabove described, the power MOSFET 100 is provided with the impurity layer 3 having the impurity concentration higher than those of the drain drift layer 2 and the impurity layer 4, while the upper surface of the impurity layer 3 is arranged upward beyond the lower ends 91 of the gate electrodes 9. Also when the trenches 7 are shallowly formed in order to reduce the capacitance of the gate electrodes 9, therefore, the impurity layer 3 can inhibit the depletion layer formed on the p-n junction between the impurity layer 4 and the base layer 5 from extending downward beyond the lower ends 91 of the gate electrodes 9 in a state where no voltage is applied between the drain electrode 11 and the source diffusion layer 6. Thus, the drain drift layer 2 located under the lower ends 91 of the gate electrodes 9 can be inhibited from formation of a depletion layer whose potential is hardly controllable with the gate electrodes 9, whereby the power MOSFET 100 can be inhibited from increase of ON-state resistance. Thus, the power MOSFET 100 can be inhibited from reduction in responsibility in a linear region.

According to the first embodiment, the impurity layer 4 having the impurity concentration lower than that of the impurity layer 3 is provided between the impurity layer 3 and the base layer 5. According to this structure, the width of the depletion layer formed on the p-n junction between the impurity layer 4 and the base layer 5 can be increase as compared with a case of directly bonding an n-type impurity layer and a p-type base layer to each other. Therefore, the p-n junction can be inhibited from reduction in avalanche resistance. Further, the power MOSFET 100 is provided with the drain drift layer 2 having the impurity concentration lower than the impurity concentration of the impurity layer 3, whereby the drain drift layer 2 having higher resistance than the impurity layer 3 can relax an electric field resulting from a voltage applied between the drain electrode 11 and the source diffusion layer 6. Therefore, the power MOSFET 100 can be inhibited from reduction in withstand voltage.

According to the first embodiment, the lower surface of the impurity layer 3 is arranged on the position of the depth corresponding to the portions close to the lower ends 91 of the gate electrodes 9. According to this structure, the capacitance can be reduced on trench bottom surfaces of the gate electrodes 9 dissimilarly to a case of arranging the lower surface of an n-type impurity layer downward beyond the lower ends of trenches. Therefore, increase in the capacitance of the gate electrodes 9 can be suppressed.

According to the first embodiment, the impurity concentration of the impurity layer 3 is lower than that of the source diffusion layer 6. According to this structure, the capacitance between the gate electrodes 9 and the impurity layer 3 can be inhibited from increase resulting from the impurity concentration of the impurity layer 3. Thus, increase in the capacitance of the gate electrodes 9 can be suppressed. When a high voltage is applied to a drain, a depletion layer can so sufficiently spread that the power MOSFET 100 can have a high withstand voltage.

According to the first embodiment, the drain drift layer 2 and the impurity layer 4 have substantially identical impurity concentrations. According to this structure, the impurity layer 4 can be formed simultaneously with the drain drift layer 2 formed by the epitaxial silicon layer. Thus, increase in the number of manufacturing steps can be suppressed.

Second Embodiment

The structure of a power MOSFET 200 according to a second embodiment of the present invention is now described with reference to FIG. 4. In the power MOSFET 200 according to the second embodiment, lower ends 7a of trenches 7 are arranged upward beyond the lower surface of an n-type impurity layer 201, dissimilarly to the aforementioned first embodiment. In other words, the trenches 7 are so formed as to reach the impurity layer 201 through a source diffusion layer 6, a base layer 5 and an impurity layer 4 in the second embodiment.

Figure 4:
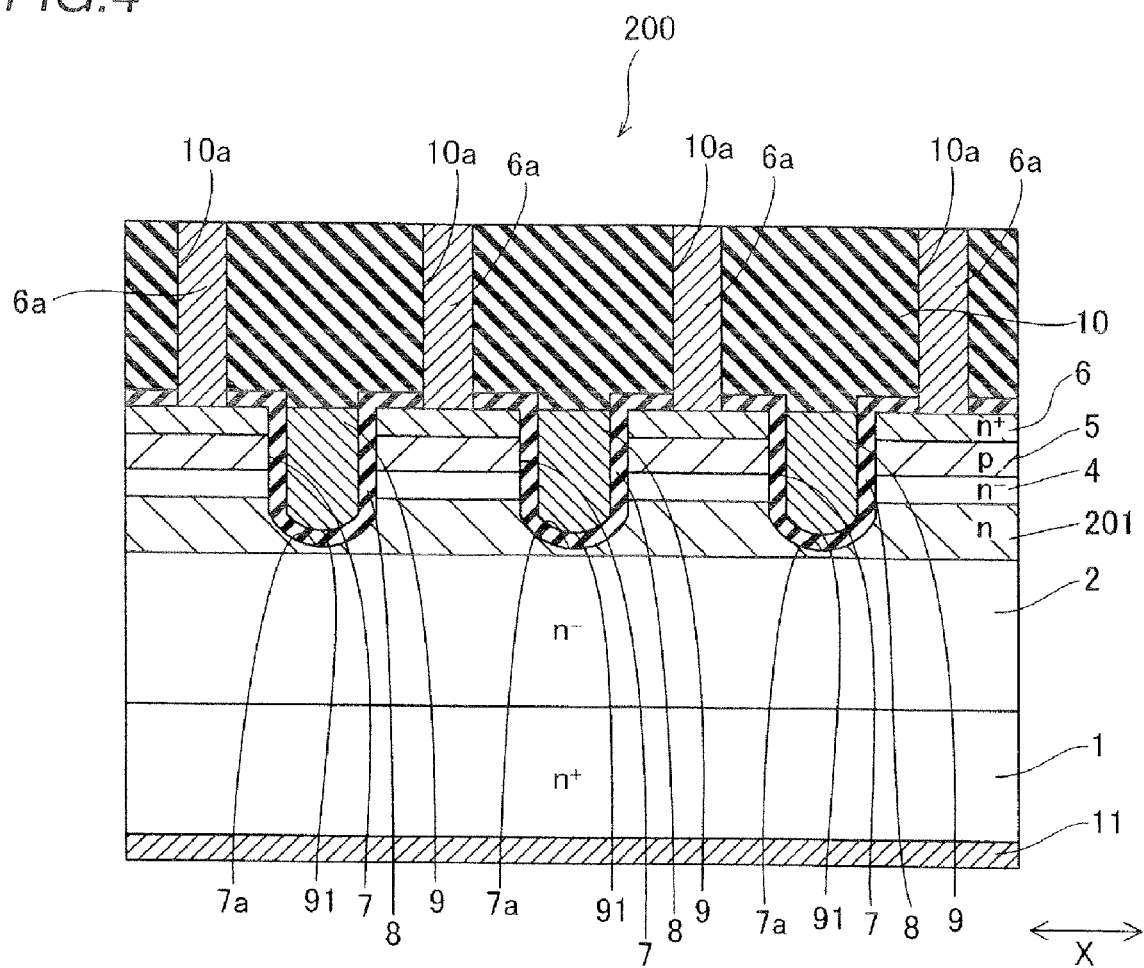
FIG. 4 is a sectional view for illustrating the structure of a power MOSFET according to a second embodiment of the present invention.

The impurity layer 201 has a thickness larger than that of the impurity layer 4, and is formed on a drain drift layer 2, as shown in FIG. 4. This impurity layer 201 is formed by doping an epitaxial silicon layer with phosphorus (P). The impurity layer 201 has an impurity concentration higher than that of the drain drift layer 2. The impurity layer 201 is an example of the "second semiconductor layer" in the present invention.

The remaining structure of the second embodiment is similar to that of the aforementioned first embodiment.

According to the second embodiment, as hereinabove described, the lower surface of the impurity layer 201 is arranged downward beyond the lower ends 7a of the trenches 7. According to this structure, gate insulating films 8 and gate electrodes 9 are not arranged on the boundary between the drain drift layer 2 and the impurity layer 201, whereby the contact area between the drain drift layer 2 and the impurity layer 201 can be increased. Thus, an area of the drain drift layer 2 passing a current therethrough can be increased, thereby reducing the ON-state resistance of the power MOSFET 200.

The remaining effects of the second embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the impurity concentrations of the drain drift layer 2 and the impurity layer 4 are identical to each other in each of the aforementioned first and second embodiments, the present invention is not restricted to this but the impurity concentrations of the $n^-$-type drain drift layer 2 and the $n^-$-type impurity layer 4 may alternatively be different from each other.

While the impurity concentration of the impurity layer 3 (201) is lower than that of the source diffusion layer 6 in each of the aforementioned first and second embodiments, the present invention is not restricted to this but the impurity concentration of the n-type impurity layer 3 (201) may alternatively be higher than that of the n-type source diffusion layer 6.

While the gate electrodes 9 are prepared from the polysilicon layer doped with phosphorus (P) in each of the aforementioned first and second embodiments, the present invention is not restricted to this but metal silicide films of WSi or the like may be formed on the gate electrodes 9, in order to reduce the resistance of the gate electrodes 9.

While the gate insulating films 8 are formed by thermal oxidation after formation of the trenches 7 in the aforementioned first embodiment, the present invention is not restricted to this but round oxidation and removal of a silicon oxide film formed by round oxidation may be performed after formation of the trenches 7 and before formation of the gate insulating film 8, in order to round the corners of the trenches 7.

What is claimed is:

1. A semiconductor device comprising:
    a first conductivity type first semiconductor layer, formed on the upper surface of a substrate, having a first impurity concentration;
    a first conductivity type second semiconductor layer, formed on said first semiconductor layer, having a second impurity concentration higher than said first impurity concentration;
    a first conductivity type third semiconductor layer, formed on said second semiconductor layer, having a third impurity concentration lower than said second impurity concentration;
    a second conductivity type fourth semiconductor layer formed on said third semiconductor layer;
    a first conductivity type fifth semiconductor layer formed on said fourth semiconductor layer; and
    an electrode formed in a trench, so provided as to reach said second semiconductor layer through at least said fifth semiconductor layer, said fourth semiconductor layer and said third semiconductor layer, in contact with an insulating film, wherein
    the upper surface of said second semiconductor layer is arranged upward beyond the lower end of said electrode, the semiconductor device further comprising plugs arranged so as not to overlap said electrode in plan view and connected with said fifth semiconductor layer, wherein the width of said plugs in a direction intersecting with the extensional direction of said plugs is smaller than the width of said electrode in the direction intersecting with the extensional direction of said plugs.

2. The semiconductor device according to claim 1, wherein the lower surface of said second semiconductor layer is arranged on a position of a depth corresponding to the lower end of said electrode.

3. The semiconductor device according to claim 2, wherein the thickness of said second semiconductor layer is substantially equal to the thickness of said third semiconductor layer.

4. The semiconductor device according to claim 1, wherein a p-n junction is formed on the interface between said third semiconductor layer and said fourth semiconductor layer.

5. The semiconductor device according to claim 1, wherein the lower surface of said second semiconductor layer is arranged downward beyond the lower end of said trench.

6. The semiconductor device according to claim 5, wherein the thickness of said second semiconductor layer is larger than the thickness of said third semiconductor layer.

7. The semiconductor device according to claim 1, wherein the thicknesses of said second semiconductor layer and said third semiconductor layer are smaller than the thickness of said first semiconductor layer.

8. The semiconductor device according to claim 1, wherein
said fifth semiconductor layer has a fourth impurity concentration, and
said second impurity concentration of said second semiconductor layer is lower than said fourth impurity concentration of said fifth semiconductor layer.

9. The semiconductor device according to claim 1, wherein
said first impurity concentration of said first semiconductor layer and said third impurity concentration of said third semiconductor layer are substantially identical to each other, and
said second impurity concentration of said second semiconductor layer is higher than said first impurity concentration of said first semiconductor layer and said third impurity concentration of said third semiconductor layer.

10. The semiconductor device according to claim 1, wherein
the thickness of said first conductivity type third semiconductor layer is smaller than the thickness of said second conductivity type fourth semiconductor layer.

11. The semiconductor device according to claim 1, wherein
said electrode is a gate electrode, and
the lower end of said gate electrode is rounded.

12. The semiconductor device according to claim 1, wherein
said first semiconductor layer, said fourth semiconductor layer and said fifth semiconductor layer are a drain drift layer, a base layer and a source diffusion layer respectively, and
said second semiconductor layer and said third semiconductor layer are arranged between said drain drift layer and said base layer.

13. The semiconductor device according to claim 1, wherein
said substrate has a first conductivity type fifth impurity concentration higher than said first impurity concentration of said first semiconductor layer, said second impurity concentration of said second semiconductor layer and said third impurity concentration of said third semiconductor layer.

14. The semiconductor device according to claim 1, wherein
a first conductivity type first impurity is introduced into said second semiconductor layer and said third semiconductor layer, and
a first conductivity type second impurity different from said first conductivity type first impurity is introduced into said fifth semiconductor layer.

15. The semiconductor device according to claim 1, wherein
the impurity concentrations of the first semiconductor layer and the third semiconductor layer are different from each other.

* * * * *